United States Patent
Kanbara et al.

(10) Patent No.: US 9,093,584 B2
(45) Date of Patent: Jul. 28, 2015

(54) SOLAR CELL ARRAY

(75) Inventors: Tatsuji Kanbara, Ebina (JP); Yuta Nishio, Omihachiman (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 14/123,460

(22) PCT Filed: May 29, 2012

(86) PCT No.: PCT/JP2012/063787
§ 371 (c)(1),
(2), (4) Date: Jan. 9, 2014

(87) PCT Pub. No.: WO2012/165437
PCT Pub. Date: Dec. 6, 2012

(65) Prior Publication Data
US 2014/0109954 A1 Apr. 24, 2014

(30) Foreign Application Priority Data

Jun. 3, 2011 (JP) ................................. 2011-125367
Mar. 29, 2012 (JP) ................................. 2012-077978

(51) Int. Cl.
*E04D 13/18* (2014.01)
*H01L 31/042* (2014.01)
(Continued)

(52) U.S. Cl.
CPC .............. *H01L 31/0422* (2013.01); *F24J 2/526* (2013.01); *F24J 2/5207* (2013.01); *F24J 2/5211* (2013.01);
(Continued)

(58) Field of Classification Search
CPC ... H01L 31/0422; H01L 31/042; H02S 20/00; H02S 20/23; F24J 2/5211; F24J 2/526; F24J 2/5207; F24J 2002/0046; F24J 2002/5281; F24J 2002/0069; F24J 2002/4672; Y02B 10/12

USPC ................ 52/29, 173.3, 655.1; 126/621, 623; 136/244, 251
See application file for complete search history.

(56) References Cited

U.S. PATENT DOCUMENTS 6,672,018 B2  1/2004  Shingleton
8,336,264 B2  12/2012  Sato et al.
(Continued)

FOREIGN PATENT DOCUMENTS

DE  20 2009 007 526 U1  8/2009
EP  2295894 A2  3/2011
(Continued)

OTHER PUBLICATIONS

International Preliminary Report on Patentability dated on Dec. 19, 2013, issued for International Application No. PCT/JP2012/063787.
(Continued)

*Primary Examiner* — Patrick Maestri
(74) *Attorney, Agent, or Firm* — Procopio, Cory, Hargreaves & Savitch LLP

(57) ABSTRACT

A solar cell array includes solar cell modules arranged in a first-direction, and a mounting member for securing adjacent ones of the solar cell modules. The mounting member comprises a first supporting member extending in the first-direction, a second supporting member provided on the first supporting member and extending in a second-direction, a first restraint provided on one side of the second supporting member in the first-direction and configured to restrain the second supporting member from moving in the second-direction and in a height direction, and a second restraint provided on another side of the second supporting member in the first-direction and configured to restrain the second supporting member from moving in the height direction. The first restraint is movable together with the second supporting member in the first-direction on the first supporting member. The second restraint restrains the second supporting member from moving in the first-direction.

8 Claims, 11 Drawing Sheets

(51) Int. Cl.
 F24J 2/52 (2006.01)
 H02S 20/23 (2014.01)
 F24J 2/00 (2014.01)
 F24J 2/46 (2006.01)

(52) U.S. Cl.
 CPC .......... *H02S 20/00* (2013.01); *H02S 20/23* (2014.12); *F24J 2002/0046* (2013.01); *F24J 2002/0069* (2013.01); *F24J 2002/4672* (2013.01); *F24J 2002/5218* (2013.01); *F24J 2002/5281* (2013.01); *Y02B 10/12* (2013.01); *Y02E 10/47* (2013.01); *Y02E 10/50* (2013.01)

(56) References Cited

U.S. PATENT DOCUMENTS

2006/0118163 A1* 6/2006 Plaisted et al. ............... 136/251
2008/0302407 A1* 12/2008 Kobayashi ..................... 136/251
2009/0230265 A1* 9/2009 Newman et al. ......... 248/229.11
2012/0167364 A1 7/2012 Koch et al.

FOREIGN PATENT DOCUMENTS

| JP | 2002-220904 A | 8/2002 |
| JP | 2003-035016 A | 2/2003 |
| JP | 2003-096987 A | 4/2003 |
| JP | 2004-251037 A | 9/2004 |
| JP | 4429028 B2 | 12/2009 |

OTHER PUBLICATIONS

International Search Report dated Jul. 3, 2012, issued for International Application No. PCT/JP2012/063787.
Extended European Search Report dated Dec. 17, 2014 issued in counterpart European application No. EP12791971.

* cited by examiner

SOLAR CELL ARRAY

TECHNICAL FIELD

The present invention relates to a solar cell array.

BACKGROUND ART

A solar cell array includes a plurality of solar cell modules and a base to which the plurality of solar cell modules are secured. Members included in the solar cell array are fastened together with bolts and so forth. Japanese Unexamined Patent Application Publication No. 2010-90701 discloses a solar cell array that is easy to construct with a reduced number of positions of fastening with bolts and so forth.

In the solar cell array, in this manner, the solar cell module and a mounting member are secured to each other by rotating the mounting member for the solar cell module. Therefore, the center of rotation of the mounting member is positioned accurately. On the other hand, the solar cell module has a certain dimensional tolerance. If the dimensional tolerance of the solar cell module is large, it is difficult to accurately secure the solar cell module and the mounting member to each other. Consequently, reinstallation of the base or another kind of work may be required.

It is an object of the present invention to provide a solar cell array in which the accuracy required in installation work is moderate.

DISCLOSURE OF INVENTION

A solar cell array according to an embodiment of the present invention includes a plurality of solar cell modules arranged in a first direction of an installation surface, and a mounting member configured to secure adjacent ones of the plurality of solar cell modules. The mounting member comprises a first supporting member extending in the first direction, and a second supporting member provided on the first supporting member and extending in a second direction that is orthogonal to the first direction. The mounting member further comprises a first restraining member provided on one side of the second supporting member in the first direction and configured to restrain the second supporting member from moving in the second direction and in a height direction that is orthogonal to the first direction and the second direction, and a second restraining member provided on another side of the second supporting member in the first direction and configured to restrain the second supporting member from moving in the height direction. The first restraining member is movable together with the second supporting member in the first direction on the first supporting member. The second restraining member restrains the second supporting member from moving in the first direction.

In the solar cell array according to the embodiment of the present invention, after the second supporting member is moved in the first direction to a desired position and is fitted to one of the solar cell modules, the second supporting member is secured to the first supporting member with the second restraining member. Since the gap between two second supporting members that are adjacent to each other in the first direction is thus determined by the solar cell module itself, the positions of the second supporting members are determined easily. Therefore, the accuracy required in the positions where the second supporting members are to be provided is moderated. Consequently, the solar cell modules can be accurately secured to the mounting members, regardless of dimensional tolerances of the solar cell modules.

BRIEF DESCRIPTION OF DRAWINGS

FIGS. 1A to 1C include diagrams illustrating a solar cell array according to a first embodiment, in which FIG. 1A is a perspective view, FIG. 1B is a sectional view taken along line A-A' illustrated in FIG. 1A, and FIG. 1C is an enlargement view of part B illustrated in FIG. 1B.

FIGS. 2A and 2B include diagrams illustrating one of solar cell modules included in the solar cell array according to the first embodiment, in which FIG. 2A is a plan view, and FIG. 2B is a sectional view taken along line C-C' illustrated in FIG. 2A.

FIGS. 3A and 3B include diagrams illustrating a mounting member and parts of solar cell modules included in the solar cell array according to the first embodiment, in which FIG. 3A is an exploded perspective view, and FIG. 3B is a perspective view in an assembled state.

FIGS. 9A and 9B include diagrams illustrating a mounting member and parts of solar cell modules included in a solar cell array according to a fourth embodiment, in which FIG. 9A is an exploded perspective view, and FIG. 9B is a perspective view in an assembled state.

DESCRIPTION OF EMBODIMENTS

Solar cell arrays according to embodiments of the present invention will now be described with reference to the drawings.

First Embodiment

Figure 1A:
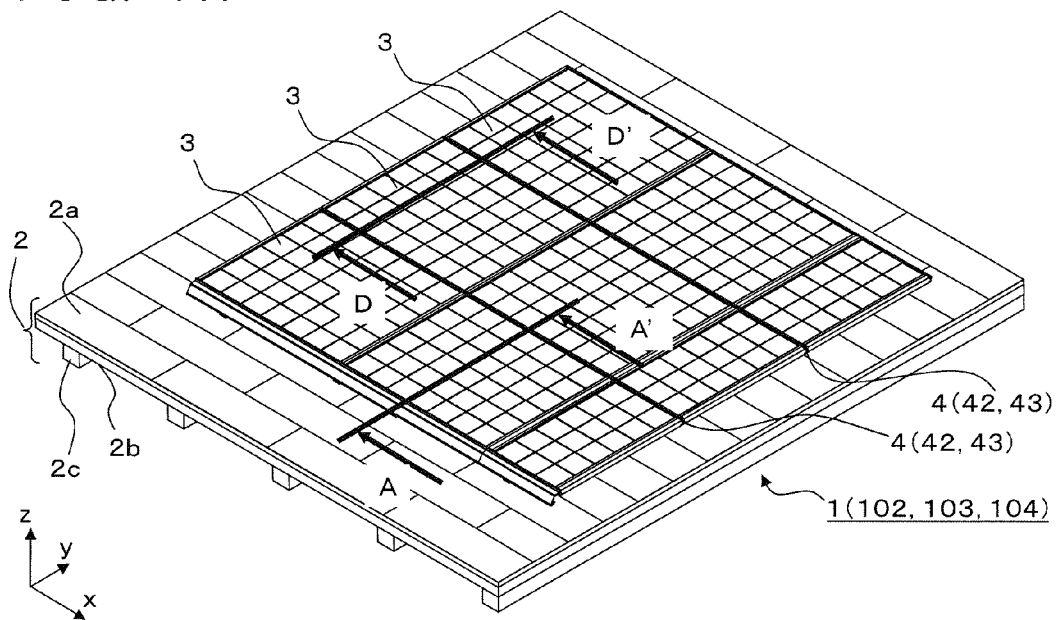
Figure 1B:
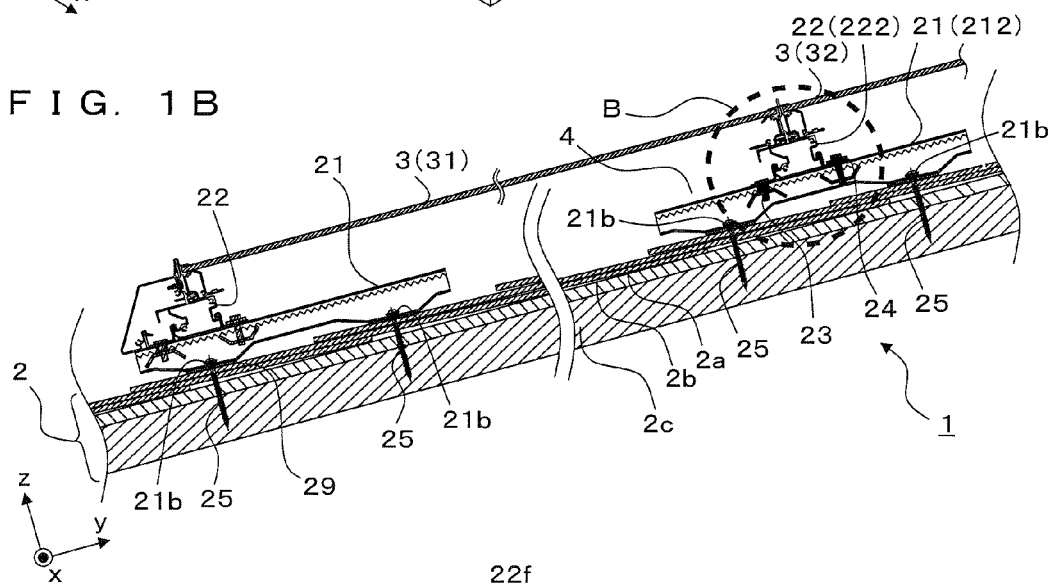
Figure 1C:
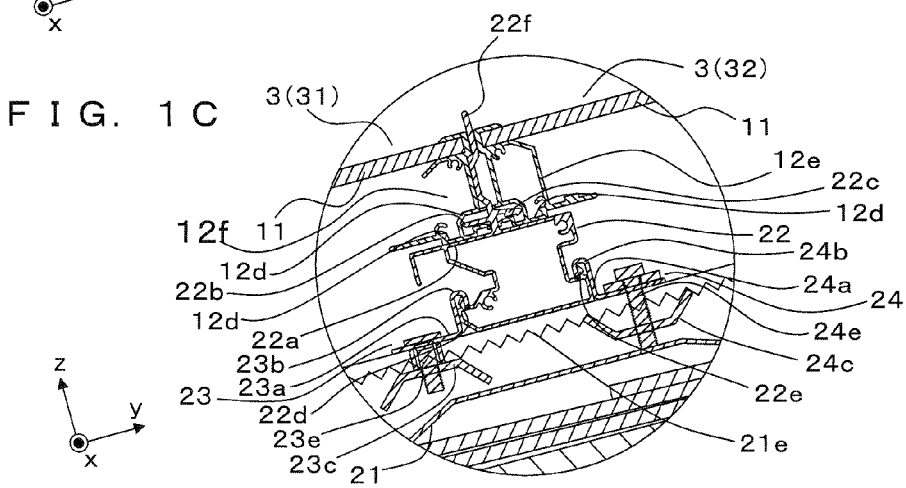

As illustrated in FIGS. 1A to 1C, a solar cell array 1 according to a first embodiment includes a plurality of solar cell modules 3 and mounting members 4 on which the solar cell modules 3 are mounted. For example, the solar cell modules 3 are secured onto a sloping surface 2 (an installation surface or a roof surface) with the mounting members 4. The sloping surface 2 includes shingles 2a, a sheathing roof board 2b, and rafters 2c.

<Solar Cell Module>

Figure 2A:
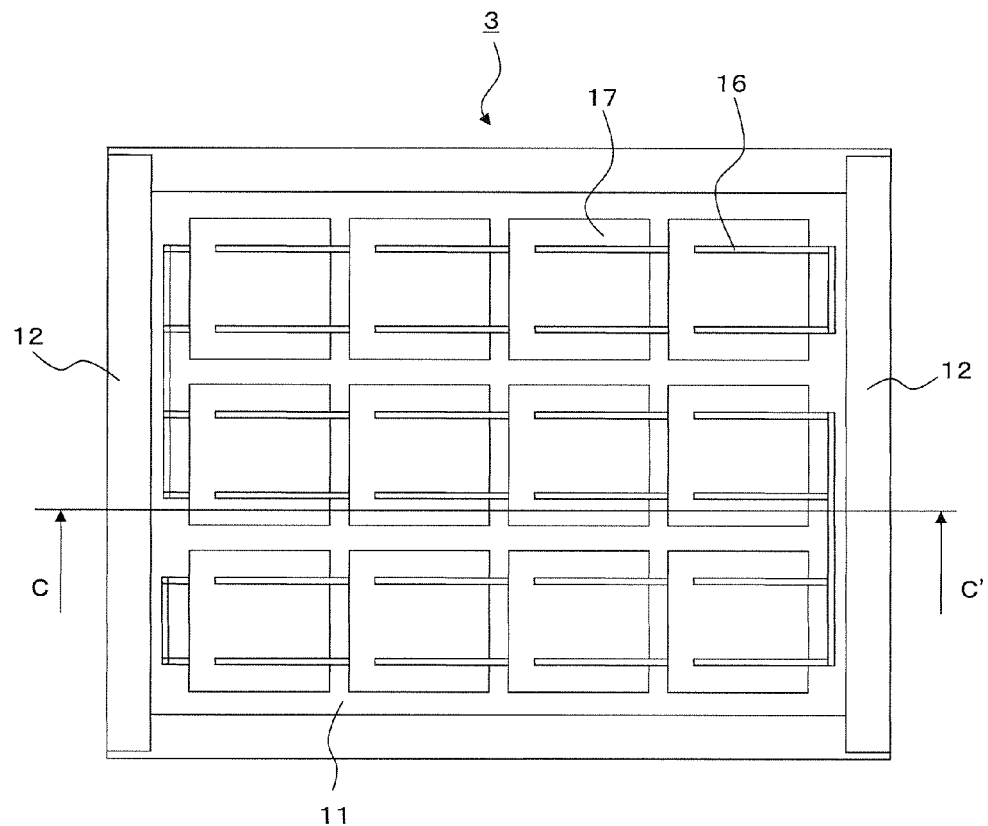
Figure 2B:
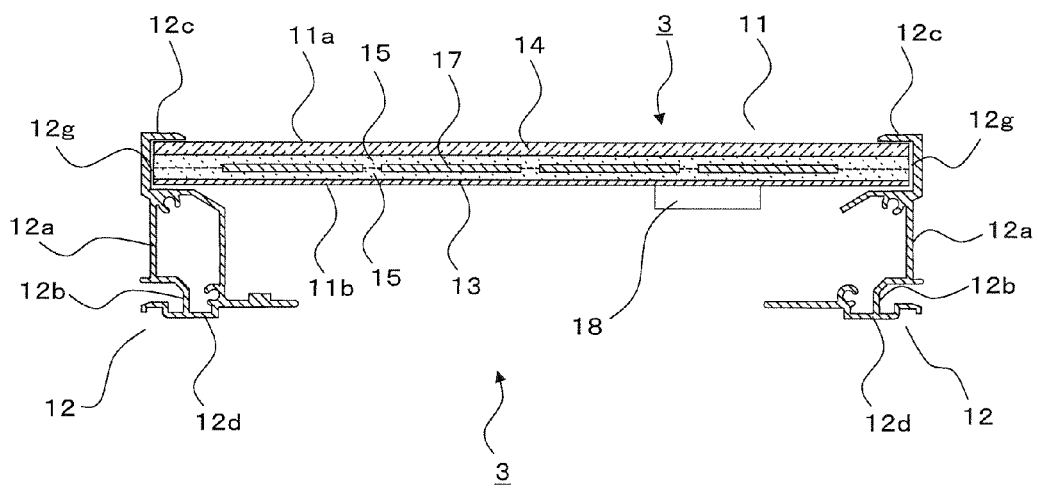
Figure 3A:
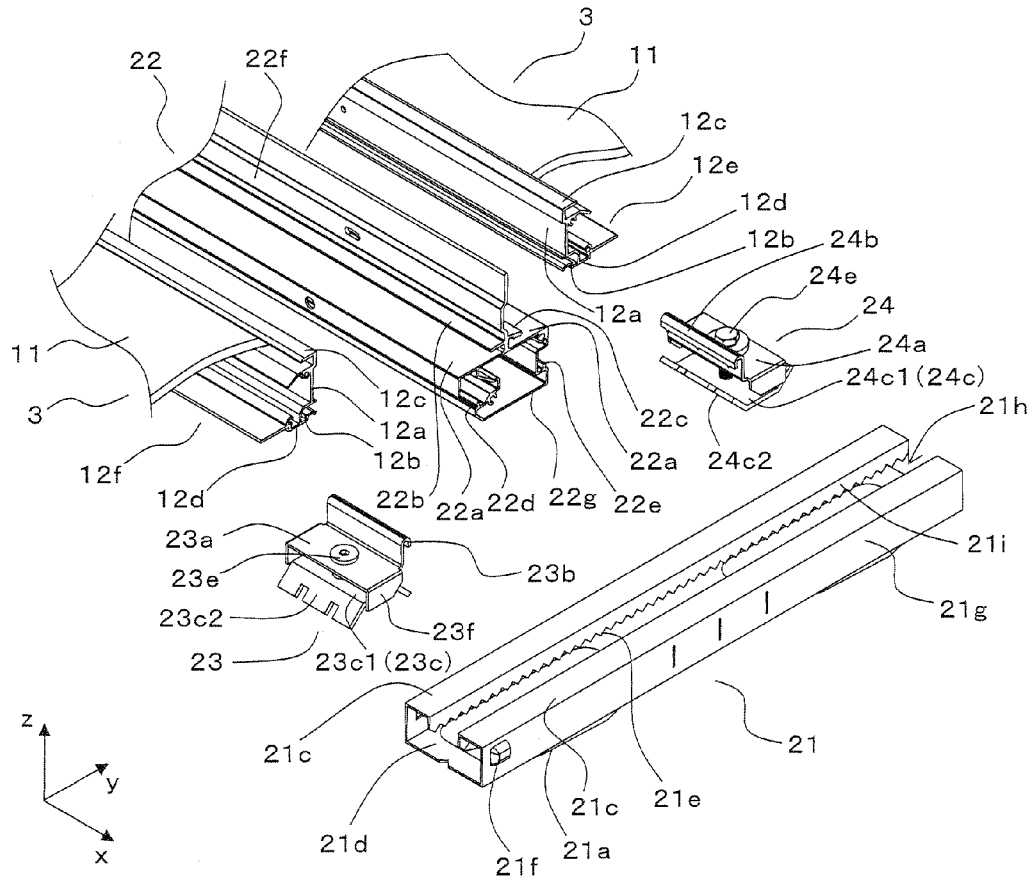
Figure 3B:
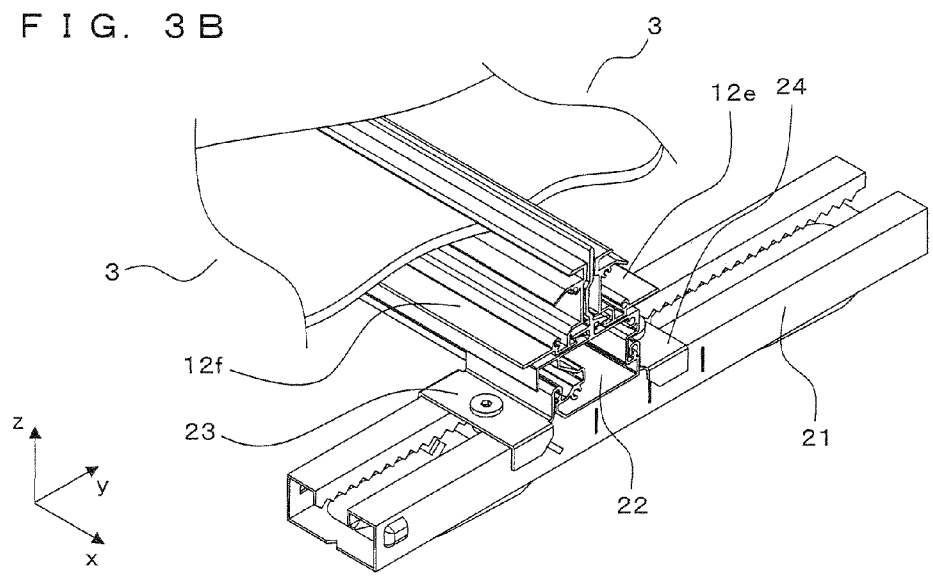

As illustrated in FIGS. 2A and 2B, each solar cell module 3 includes a solar cell panel 11 reinforced with frames 12.

As illustrated in FIG. 2B, the solar cell panel 11 includes a light-receiving surface 11a (a major surface of a light-transmissive substrate 14) on which the solar cell panel 11 mainly receives light, and a non-light-receiving surface 11b (a major surface of a backside-protecting member 13) residing opposite the light-receiving surface 11a.

The solar cell panel 11 includes the light-transmissive substrate 14, a pair of filler members 15, a plurality of solar cell elements 17, the backside-protecting member 13, and a terminal box 18 provided in that order from the side thereof having the light-receiving surface 11a.

The light-transmissive substrate 14 functions as a substrate of the solar cell module 3. Each filler member 15 included in the pair of filler members 15 is made of thermosetting resin, for example. The plurality of solar cell elements 17 are protected by the filler members 15 provided therearound and are electrically connected to one another with an inner lead 16. The backside-protecting member 13 protects the backside of the solar cell module 3. The terminal box 18 extracts power generated by the solar cell elements 17 to the outside.

The non-light-receiving surface 11b does not necessarily receive no light. For example, the backside-protecting member 13 and one of the filler members 15 that is provided between the backside-protecting member 13 and the solar cell elements 17 may each be made of a light-transmissive material, whereby some of incident light may be received by the non-light-receiving surface 11b.

The solar cell elements 17 are, for example, substrates that are made of monocrystalline silicon, polycrystalline silicon, or the like. If such silicon substrates are employed, adjacent ones of the silicon substrates may be electrically connected to each other with the inner lead 16, as described above.

The type of the solar cell elements 17 is not specifically limited. For example, the solar cell elements 17 may each be any of a thin-film solar cell including an amorphous-silicon, a CIGS solar cell, a CdTe solar cell, a solar cell in which a thin-film amorphous material is provided on a crystalline silicon substrate, and the like. In an exemplary solar cell that is made of amorphous silicon, CIGS, or CdTe, an amorphous silicon layer, a CIGS layer, or a CdTe layer is appropriately stacked on a light-transmissive substrate in combination with transparent electrodes and other elements.

The terminal box 18 includes a box body, a terminal plate provided in the box body, and an output cable through which electric power is fed to the outside of the box body. The box body is made of, for example, modified polyphenylene ether resin (modified PPE resin) or polyphenylene oxide resin (PPO resin).

The frames 12 each have a function of holding the solar cell panel 11. As illustrated in FIGS. 2A and 2B, each frame 12 is a long member that reinforces the periphery of the solar cell panel 11. The frame 12 includes a fitting portion 12g, a frame upper face 12c, a frame bottom face 12d, a frame side face 12a, and a frame recessed portion 12b. The fitting portion 12g is fitted onto the solar cell panel 11 when the solar cell array 1 is installed as to be described below. The frame upper face 12c is a major face residing on a side on which sunlight is received. The frame bottom face 12d is another major face residing on a side opposite the frame upper face 12c. The frame side face 12a connects the frame upper face 12c and the frame bottom face 12d to each other.

The frame recessed portion 12b engages with a second supporting member 22 to be described below. In the present embodiment, the frame side face 12a on a ridge side and the frame side face 12a on an eaves side have the same shape. The frame recessed portion 12b may be narrowed from the inlet side thereof toward the back side thereof so as to easily guide a first projecting portion 22b or a second projecting portion 22c to be described below that is to be fitted thereinto. If the first projecting portion 22b or the second projecting portion 22c includes a protruding portion at the tip thereof for engagement, the frame recessed portion 12b may include a part that is to engage with the protruding portion.

The frame 12 configured as described above can be fabricated by a method such as aluminum extrusion molding, for example.

In the present embodiment, the eaves side corresponds to the lower side in the Y direction, which is a first direction, and the ridge side corresponds to the upper side in the Y direction. That is, in the present embodiment, the sloping surface slopes in the Y direction. Hereinafter, regarding the solar cell module 3 of the solar cell array 1, the frame 12 on the eaves side is denoted as eaves-side frame 12e, and the frame 12 on the ridge side is denoted as ridge-side frame 12f.

<Mounting Member>

Referring to FIGS. 1A to 1C, 3A and 3B, the mounting members 4 will now be described. The mounting members 4 each includes a first supporting member 21, the second supporting member 22, a first restraining member 23, and a second restraining member 24.

The first supporting member 21 is secured to the sloping surface 2 with the longitudinal direction thereof being the Y direction. The second supporting member 22 is provided with the longitudinal direction thereof being the X direction, which is a second direction that is orthogonal to the first supporting member 21. The second supporting member 22 is provided on the first supporting member 21. The second supporting member 22 is secured at two end sides thereof in the Y direction with the first restraining member 23 and the second restraining member 24, respectively.

The first restraining member 23 is provided on the eaves side (on the −Y-direction side) of the second supporting member 22 in the Y direction. The second restraining member 24 is provided on the ridge side (on the +Y-direction side) of the second supporting member 22 in the Y direction.

The first restraining member 23 restrains the second supporting member 22 on the first supporting member 21 in the X direction and in the Z direction, which corresponds to the height direction. Meanwhile, the first restraining member 23 is movable in the Y direction. In a state where a securing member 24e of the second restraining member 24 to be described below is loosened, the second restraining member 24 restrains the second supporting member 22 on the first supporting member 21 in the X direction and in the Z direction but not in the Y direction. In contrast, in a state where the securing member 24e is fastened, the second restraining member 24 restrains the second supporting member 22 from moving in the Y direction on the first supporting member 21. The second restraining member 24 may restrain the second supporting member 22 from moving in the X direction and in the Z direction.

The members included in the mounting member 4 will now be described in detail with reference to drawings.

<First Supporting Member>

Referring to FIGS. 1A to 1C, 3A and 3B, the first supporting member 21 will now be described.

In the present embodiment, the first supporting member 21 is a hollow plate-like body provided on the sloping surface 2 with the longitudinal direction thereof being the Y direction. More specifically, the first supporting member 21 has a substantially U sectional shape.

The first supporting member 21 includes a bottom portion 21a, through holes 21b, a pair of first supporting portions 21c (upper supporting portions), side portions 21g, and a rail groove portion 21h. Furthermore, the first supporting member 21 includes a cavity portion 21d provided between the bottom portion 21a and the first supporting portions 21c. For example, the length of the first supporting member 21 in the Y direction may be smaller than half the length of the solar cell module 3 in the Y direction.

The bottom portion 21a is a portion of the first supporting member 21 that is to face the sloping surface 2, and is a substantially rectangular plate-like body. The pair of side portions 21g extend perpendicularly from the bottom portion 21a.

The through holes 21b are provided in the bottom portion 21a. Screws 25 that secure the first supporting member 21 to the sloping surface 2 are inserted into the respective through holes 21b.

The pair of first supporting portions 21c (upper supporting portions) extend from two respective sides of an opening of the substantially U sectional shape. That is, each first supporting portion 21c included in the pair of first supporting portions 21c is provided opposite the bottom portion 21a and extend from the respective side portions 21g toward the rail groove portion 21h. The pair of first supporting portions 21c support the second supporting member 22.

The cavity portion 21d is provided between the bottom portion 21a and the pair of first supporting portions 21c. That is, the cavity portion 21d is a hollow portion in the first supporting member 21.

The rail groove portion 21h is provided between the pair of first supporting portions 21c and extends in the Y direction. The rail groove portion 21h restrains the first restraining member 23 and the second restraining member 24 from moving in the X direction but allows the first restraining member 23 and the second restraining member 24 to move in the Y direction.

The rail groove portion 21h includes a pair of inner wall portions 21i extending along the cavity portion 21d and projecting downward from the pair of first supporting portions 21c, respectively. Specifically, the inner wall portions 21i are each a plate-like body hanging down from a corresponding one of the pair of first supporting portions 21c toward the bottom portion 21a. The inner wall portions 21i may each have irregularities at the lower end thereof. More specifically, the lower end of each inner wall portion 21i may form a serrated portion 21e in which concavities and convexities are provided alternately. The serrated portion 21e locks a second stopper 24c of the second restraining member 24 to be described below. Hence, when the securing member 24e is fastened, the second supporting member 22 is restrained in the Y direction by the second restraining member 24.

The first supporting member 21 further includes come-off-preventing portions 21f projecting from the respective side portions 21g. The come-off-preventing portions 21f prevent the first restraining member 23 from easily coming off the first supporting member 21 from the eaves side when the first restraining member 23 is moved in the Y direction during the installation of the solar cell module 3.

The first supporting member 21 can be fabricated by roll forming or bending with a bender of a stainless steel sheet, a plated steel sheet, or the like. If the first supporting member 21 is made of another metal instead of a stainless steel sheet or a plated steel sheet, the first supporting member 21 may be fabricated by extrusion of a metal such as an aluminum alloy.

<Second Supporting Member>

Referring to FIGS. 1A to 1C, 3A and 3B, the second supporting member 22 will now be described.

In the present embodiment, the second supporting member 22 is a long body provided on the first supporting member 21 with the longitudinal direction thereof being the X direction. The length of the second supporting member 22 in the longitudinal direction (X direction) can be set appropriately in accordance with the length and the material of the solar cell module 3. For example, the length of the second supporting member 22 in the longitudinal direction (X direction) may be substantially the same as the length of the solar cell module 3 in the X direction. If the length of the second supporting member 22 in the longitudinal direction (X direction) is set to a multiple of the length of the solar cell module 3 in the X direction, the number of second supporting members 22 can be reduced.

In the present embodiment, the second supporting member 22 is a rectangular pipe-like body having a closed cross-section. The second supporting member 22 includes a second supporting portion 22a, the first projecting portion 22b, the second projecting portion 22c, a first protruding portion 22d, a second protruding portion 22e, a plate-like portion 22f, and a bottom portion 22g.

The second supporting portion 22a is a surface that supports the frame bottom face 12d of the solar cell module 3 and extends in the X direction.

The plate-like portion 22f extends upward from the second supporting portion 22a and perpendicularly to the upper surface of the second supporting portion 22a. The plate-like portion 22f extends in the longitudinal direction of the second supporting member 22 (in the X direction). In the present embodiment, the plate-like portion 22f is provided substantially at the center of the second supporting portion 22a in the short-side direction of the second supporting member 22.

The bottom portion 22g is in contact with the first supporting portions 21c of the first supporting member 21 and resides below the second supporting portion 22a.

As illustrated in FIG. 1C, the first protruding portion 22d and the second protruding portion 22e are protruding portions provided on two sides of the bottom portion 22g in the Y direction and protruding in the Z direction. The first protruding portion 22d is connectable with the first restraining member 23. The second protruding portion 22e is connectable with the second restraining member 24.

The first projecting portion 22b and the second projecting portion 22c are provided on two respective sides of the plate-like portion 22f and extend in the Y direction. The first projecting portion 22b engages with the frame recessed portion 12b of a solar cell module 3 provided on the eaves side. The second projecting portion 22c engages with the frame recessed portion 12b of a solar cell module 3 provided on the ridge side. With such engagements, the solar cell modules 3 that are adjacent to each other in the Y direction are secured to the second supporting member 22.

The length of the first projecting portion 22b in the Y direction is smaller than the length from the plate-like portion 22f to a corresponding one of the ends of the second supporting portion 22a in the Y direction. Hence, the first projecting portion 22b and the frame recessed portion 12b can be made to engage with each other by placing the frame 12 of the solar cell module 3 on the second supporting portion 22a and sliding the second supporting member 22 in the −Y direction toward the eaves side. The same applies to the length of the second projecting portion 22c in the Y direction.

The length of the plate-like portion 22f in the Z direction is larger than the length of the frame 12 in the Z direction. Hence, after the installation of the solar cell array 1, the plate-like portion 22f projects beyond the frame upper face 12c of the frame 12 and can function as a snow guard.

The second supporting member 22 can be fabricated in the same manner as for the first supporting member 21.

<First Restraining Member>

The first restraining member 23 will now be described with reference to FIGS. 1A to 1C, 3A and 3B.

The first restraining member 23 includes a first engaging member 23a, a first hook portion 23b, a first stopper 23c, and a shaft portion 23e.

The first engaging member 23a and the first stopper 23c are connected by the shaft portion 23e. The first engaging member 23a is placed on the first supporting member 21. The first supporting portions 21c are held between the first engaging member 23a and the first stopper 23c, which is placed on the inner side (in the cavity portion 21d) of the first supporting member 21. That is, the first stopper 23c is placed in the cavity portion 21d of the first supporting member 21 and opposite the first engaging member 23a.

In this state, the distance between the first engaging member 23a and the first stopper 23c is determined by the shaft portion 23e and is, for example, slightly larger than the length of the rail groove portion 21h in the Z direction. Hence, the first restraining member 23 allows the second supporting member 22 to move in the Y direction by moving of the shaft portion 23e in the cavity portion 21d.

The first hook portion 23b engages with the first protruding portion 22d of the second supporting member 22. Hence, the first restraining member 23 that is in a state of being connected to the second supporting member 22 restrains the second supporting member 22 in the X direction and in the Z direction but allows the second supporting member 22 to move in the Y direction. The restraint in the X direction is realized by a frictional force produced by the engagement between the first hook portion 23b and the first protruding portion 22d.

In the present embodiment, the first stopper 23c includes a first flat portion 23c1 that is in contact with the serrated portions 21e that are the lower ends of the inner wall portions 21i of the rail groove portion 21h. The first stopper 23c further includes a pair of first bent portions 23c2 extending from two respective ends of the first flat portion 23c1 in the Y direction toward the bottom portion 21a. As illustrated in FIG. 1C, the first flat portion 23c1 extends substantially parallel to the first supporting portions 21c. The first bent portions 23c2 are bent in a direction away from the serrated portions 21e. Hence, the first stopper 23c is not locked by the serrated portions 21e. Therefore, the first restraining member 23 is smoothly movable in the Y direction on the first supporting member 21.

The first engaging member 23a includes sidewall portions 23f hanging downward from two respective sides thereof in the X direction and along the respective side portions 21g of the first supporting member 21. The movement of the first restraining member 23 in the −Y direction is regulated by the contact between the sidewall portions 23f and the respective come-off-preventing portions 21f. Hence, the first restraining member 23 is difficult to come off the first supporting member 21 from the eaves side.

The first engaging member 23a and the first stopper 23c are fabricated by, for example, extrusion of a metal such as an aluminum alloy. If a stainless steel sheet or a plated steel sheet is used, the first engaging member 23a and the first stopper 23c are fabricated by pressing of the stainless steel sheet or the plated steel sheet. The shaft portion 23e may be made of, for example, stainless steel or the like.

<Second Restraining Member>

The second restraining member 24 will now be described with reference to FIGS. 1A to 1C, 3A and 3B.

The second restraining member 24 includes a second engaging member 24a, a second hook portion 24b, the second stopper 24c, and the securing member 24e.

The second engaging member 24a is integrated with the second stopper 24c by the securing member 24e. The second engaging member 24a is placed on the first supporting member 21. The first supporting portions 21c is held between the second engaging member 24a and the second stopper 24c, which is placed on the inner side (in the cavity portion 21d) of the first supporting member 21. That is, the second stopper 24c is placed in the cavity portion 21d of the first supporting member 21 and opposite the second engaging member 24a.

As illustrated in FIG. 1C, the securing member 24e secures the second engaging member 24a and the second stopper 24c. The securing member 24e includes, for example, a bolt and a nut, the bolt extending through the cavity portion 21d of the first supporting member 21. When the securing member 24e is fastened, the second restraining member 24 is secured onto the first supporting member 21. When the securing member 24e is fastened, a gap between the second engaging member 24a and the second stopper 24c is narrowed. Hence, the second restraining member 24 is secured onto the first supporting member 21. In contrast, when the securing member 24e is loosened, the second restraining member 24 is allowed to move in the Y direction on the first supporting member 21. When the securing member 24e that is securing the second restraining member 24 and the first supporting member 21 to each other is loosened, the gap between the second engaging member 24a and the second stopper 24c is widened. Hence, the second restraining member 24 becomes movable in the Y direction on the first supporting member 21.

The second hook portion 24b engages with the second protruding portion 22e of the second supporting member 22. Hence, when the securing member 24e is fastened with a bolt or the like, the second restraining member 24 can firmly secure the second supporting member 22 onto the first supporting member 21.

In the present embodiment, the second stopper 24c includes a second flat portion 24c1 that is spaced apart from the serrated portions 21e that are the lower ends of the inner wall portions 21i of the rail groove portion 21h. The second stopper 24c further includes a pair of second bent portions 24c2 extending from two respective ends of the second flat portion 24c1 in the Y direction toward the first supporting portions 21c. As illustrated in FIG. 1C, the second flat portion 24c1 extends substantially parallel to the first supporting portions 21c, as with the first flat portion 23c1 of the first stopper 23c. The second bent portions 24c2 are bent toward the serrated portions 21e and are in contact with the serrated portions 21e. The securing member 24e holds the second engaging member 24a and the second stopper 24c from two sides. Hence, the second bent portions 24c2 are locked by the serrated portions 21e.

The second engaging member 24a and the second stopper 24c can be fabricated in the same manner as for the first engaging member 23a and the first stopper 23c.

<Screws>

The screws 25 extend through the respective through holes 21b of the first supporting member 21 and secure the first supporting member 21 onto the sloping surface 2. The screws 25 may be made of stainless steel or hot-dip galvanized steel.

<Adhesive Members>

Adhesive members 29 are applied on the bottom portion 21a of the first supporting member 21. In a state where the first supporting member 21 is secured to the sloping surface 2, the adhesive members 29 protect regions around the secured positions where the screws 25 are provided from rainwater or moisture. The adhesive members 29 may be, for example, a silicon sealant or members obtained by cutting a sheet made of butyl or the like into strips.

As described above, in the present embodiment, the second supporting member 22 extending in the X direction is provided on the first supporting member 21 extending in the Y direction. The second supporting member 22 is movable in the Y direction on the first supporting member 21 together with the first restraining member 23 provided on one side thereof in the Y direction, but is restrained from moving in the Y direction by the second restraining member 24 provided on the other side thereof in the Y direction.

Hence, after the second supporting member 22 is moved in the first direction to a desired position and is fitted to a solar cell module, the second supporting member 22 is secured to the first supporting member 21 with the second restraining member 24. Since the gap between two second supporting members 22 that are adjacent to each other in the first direction is thus determined by the solar cell module 3 itself, the positions of the second supporting members 22 are determined easily. Therefore, the positional accuracy required for the second supporting members 22, i.e., the accuracy in the positions where the mounting members 4 are to be provided, is moderated. Consequently, solar cell modules 3 can be accurately secured to the mounting members 4.

Moreover, the fastening work on the sloping surface 2 only needs to be performed at one position, i.e., at the securing member 24e. Accordingly, working time is reduced.

Thus, in the solar cell array 1 according to the present embodiment, the number of fastening points is reduced, and the accuracy required in the installation work is moderated.

Furthermore, in the present embodiment, the two ends of the second supporting member 22 in the Y direction are secured in the Z direction by the first restraining member 23 and the second restraining member 24, respectively. Hence, when any load is applied to the second supporting member 22, the stress is shared between the first restraining member 23 and the second restraining member 24 to support the second supporting member 22. This provides a high strength against a load caused by a wind pressure, accumulated snow, or the like.

Furthermore, as in the present embodiment, the first restraining member 23 may include the first engaging member 23a and the first hook portion 23b that are slidable in the Y direction on the first supporting member 21. The second restraining member 24 includes the second engaging member 24a, the second hook portion 24b, and the securing member 24e that are slidable in the Y direction on the first supporting member 21. Hence, the second supporting member 22 can be firmly supported on the first supporting member 21 with a simple configuration.

The first restraining member 23 holds the first supporting member 21 between the first engaging member 23a thereof that is placed on the first supporting portions 21c and the first stopper 23c thereof that is placed in the cavity portion 21d of the first supporting member 21. Hence, the second supporting member 22 can stably move on the first supporting member 21.

The second stopper 24c of the second restraining member 24 also produces the same effect as the first stopper 23c when the securing member 24e is loosened.

The second supporting member 22 may be secured to the first supporting member 21 with the securing member 24e securing the second engaging member 24a and the second stopper 24c that hold the first supporting portions 21c therebetween. Thus, the first supporting member 21 and the second supporting member 22 can be firmly secured to each other at one fastening point.

As illustrated in FIG. 1C, the lower ends of the inner wall portions 21i of the rail groove portion 21h may have irregularities. In such a case, the first stopper 23c includes the first flat portion 23c1 that is in contact with the lower ends of the inner wall portions 21i. Furthermore, the second stopper 24c includes the second flat portion 24c1 that is spaced apart from the lower ends of the inner wall portions 21i and the second bent portions 24c2 that are allowed to come into contact with the inner wall portions 21i. Hence, the first restraining member 23 can smoothly move on the first supporting portions 21c of the first supporting member 21. Meanwhile, the second restraining member 24 engages with the lower ends of the inner wall portions 21i. Hence, the second supporting member 22 is firmly secured to the first supporting member 21 with the securing member 24e.

In the present embodiment, the first stopper 23c may include the first bent portions 23c2 extending from the first flat portion 23c1 and being bent toward the bottom portion 21a. Thus, the probability of catching the periphery of the first flat portion 23c1 on the serrated portions 21e is reduced, facilitating the sliding of the first restraining member 23 in the Y direction.

The second supporting member 22 may include the second supporting portion 22a, the first projecting portion 22b, and the second projecting portion 22c, the first projecting portion 22b projecting from the plate-like portion 22f in the −Y direction and the second projecting portion 22c projecting from the plate-like portion 22f in the Y direction. In such a case, the side face of each solar cell module 3 fits between the second supporting portion 22a and the first projecting portion 22b or between the second supporting portion 22a and the second projecting portion 22c. Thus, the force with which the mounting member 4 secures the solar cell module 3 in the Y direction is increased.

In such a case, the side face of the solar cell module 3 may include the frame recessed portion 12b that engages with the first projecting portion 22b or the second projecting portion 22c. Thus, the effect of increasing the securing force exerted in the Z direction is increased. The frame recessed portion 12b is provided near the second supporting portion 22a. Such a configuration can reduce the moment applied to the connection between the plate-like portion 22f and the second supporting portion 22a when any load, such as a wind pressure, in the Z direction is applied to the solar cell module 3. Furthermore, the frame recessed portion 12b is included in the frame side face 12a. Therefore, even if a protuberance for engagement is provided at the tip of the second projecting portion 22c or another portion, the light-receiving surface 11a is not likely to be shaded.

<Construction Method>

Referring to FIGS. 4A to 4D, a procedure of constructing the solar cell array 1 will now be described. To describe features of the solar cell array 1 according to the present embodiment, the installation of solar cell modules 3 in the second and subsequent rows from the eaves side in the Y direction will be described.

First, marks are provided with ink or the like on the sloping surface 2 at positions where first supporting members 21 are to be provided. The first supporting members 21 are attached to the sloping surface 2 with the aid of adhesive members 29 with reference to the marks on the sloping surface 2 and are secured to the sloping surface 2 with screws 25. Then, a solar cell module (a first solar cell module) 31 in the first row is placed on one of the mounting members 4 that is provided on the ridge side thereof. Subsequently, a second supporting member 222 of that mounting member 4 is slid in the −Y direction toward the eaves side, whereby the second supporting member 222 is made to engage with the side face of the first solar cell module 31. Subsequently, as illustrated in FIG.

4A, the second supporting member 222 is secured onto a first supporting member 212 with a first restraining member 23 and a second restraining member 24.

In FIGS. 4A to 4D, one of the mounting members 4 (for example, the one on the lower left side in FIG. 4A) that secures the ridge side (+Y-direction side) of the first solar cell module 31 and the eaves side (−Y-direction side) of a second solar cell module 32 is referred to as the mounting member 4 in the second row. Furthermore, in FIGS. 4A to 4D, the other mounting member 4 (for example, the one on the upper right side in FIG. 4C) that secures the ridge side of the second solar cell module 32 is referred to as the mounting member 4 in the third row.

Figure 4A:
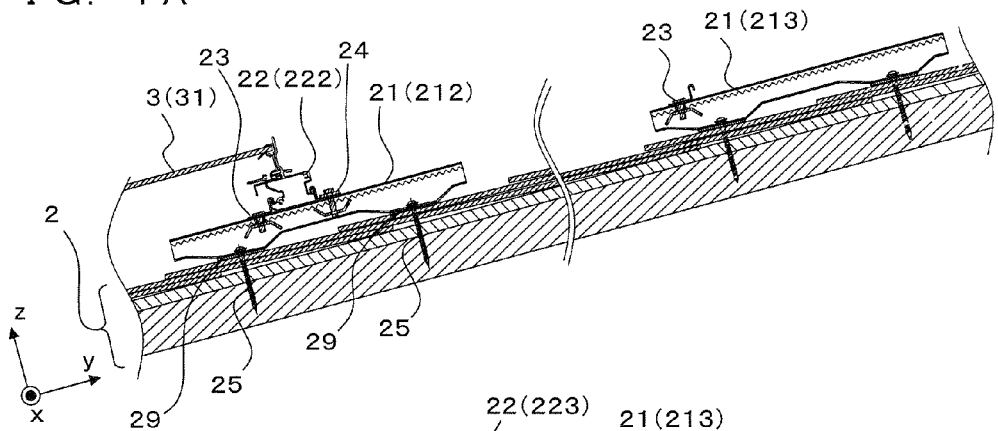
FIGS. 4A to 4D include schematic diagrams illustrating, in that order, steps of constructing the solar cell array according to the first embodiment seen at a position along line D-D' illustrated in FIG. 1A.

Subsequently, as illustrated in FIG. 4A, another first restraining member 23 is attached to a first supporting member 213 of the mounting member 4 in the third row.

Figure 4B:
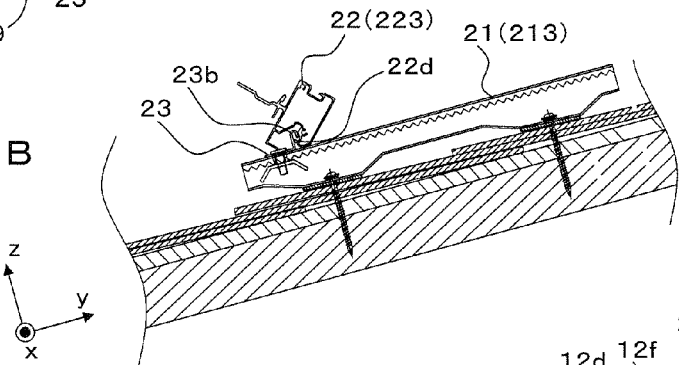

Subsequently, as illustrated in FIG. 4B, a first protruding portion 22d of a second supporting member 223 of the mounting member 4 in the third row and a first hook portion 23b of the first restraining member 23 are made to engage with each other, whereby the second supporting member 223 is placed on the first supporting member 213.

Figure 4C:
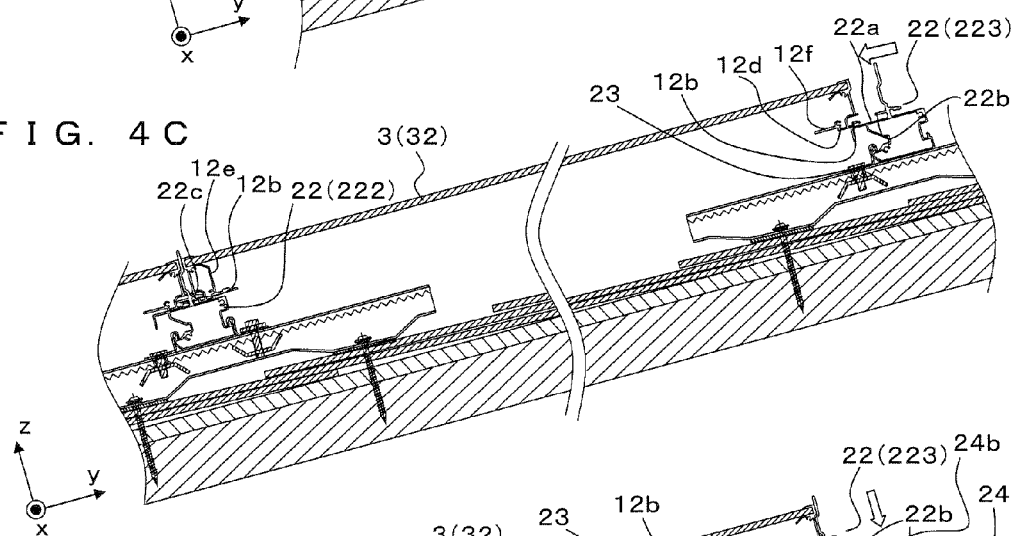

Subsequently, the solar cell module (second solar cell module) 32 in the second row is placed on the second supporting member 222 of the mounting member 4 in the second row. In this step, as illustrated in FIG. 4C, a frame recessed portion 12b of an eaves-side frame 12e of the second solar cell module 32 is made to engage with a second projecting portion 22c of the second supporting member 222 of the mounting member 4 in the second row.

Subsequently, a frame bottom face 12d of a ridge-side frame 12f of the second solar cell module 32 is placed on a second supporting portion 22a of the second supporting member 223 in the third row. In this step, a frame recessed portion 12b of the ridge-side frame 12f and a first projecting portion 22b of the second supporting member 223 are not made to engage with each other yet.

Figure 4D:
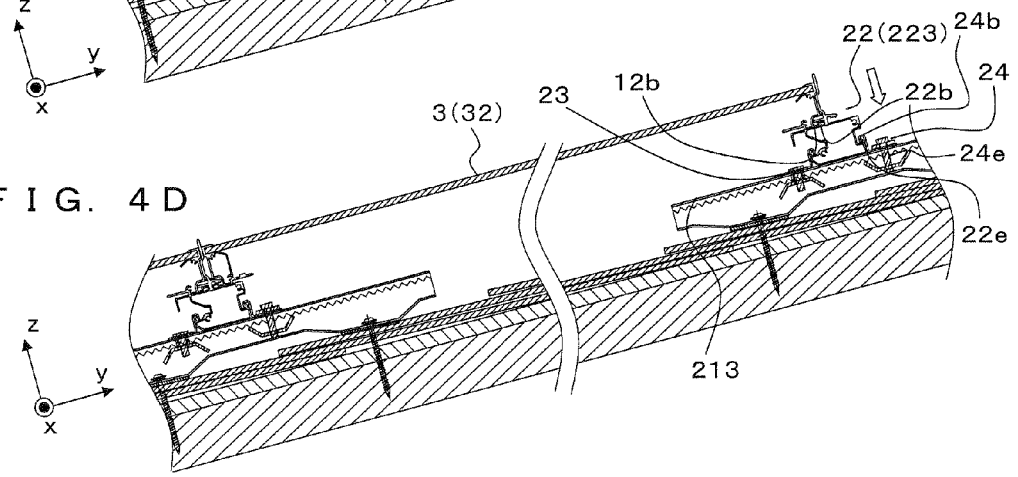

Subsequently, while the second supporting member 223 of the mounting member 4 in the third row is in engagement with the first restraining member 23, the second supporting member 223 is moved in the −Y direction toward the eaves side, whereby the first projecting portion 22b of the second supporting member 223 and the frame recessed portion 12b of the second solar cell module 32 are made to engage with each other as illustrated in FIG. 4D. Subsequently, a second protruding portion 22e of the second supporting member 223 in the third row and a second hook portion 24b of a second restraining member 24 are locked to each other, and a securing member 24e is provided and is fastened. Thus, the second supporting member 223 is secured to the first supporting member 213, whereby the second solar cell module 32 is secured to the mounting member 4 in the third row.

Solar cell modules 3 in the third and subsequent rows are each installed in the same manner as for the solar cell module 3 in the second row described above, and description of a method of installing those solar cell modules 3 is therefore omitted.

As described above, in the present embodiment, the second supporting member 22 that is locked to the first restraining member 23 is moved in the −Y direction and is fitted to the ridge side of the solar cell module 3, whereby the solar cell module 3 is secured to the second supporting member 22. That is, in the present embodiment, the gap between adjacent second supporting members 22 (for example, the gap between the second supporting member 222 of the mounting member 4 in the second row and the second supporting member 223 of the mounting member 4 in the third row) is naturally determined in the installation work in which each solar cell module 3 is held between a pair of second supporting members 22 (the second supporting member 222 and the second supporting member 223) that are adjacent to each other in the Y direction. Therefore, prior to the installation work, the accuracy required in the measurement of the positions of the sloping surface 2 where the second supporting members 22 are to be provided is moderated.

Furthermore, as illustrated in FIGS. 4C and 4D, the first restraining member 23 of the mounting member 4 in the third row that secures, from the ridge side, the second solar cell module 32 in the second row resides below the second solar cell module 32. Meanwhile, in the first restraining member 23, the first engaging member 23a and the first stopper 23c are connected to each other with the shaft portion 23e. Hence, after the second solar cell module 32 is installed, the first restraining member 23 does not need to be secured to the first supporting member 21. Therefore, the number of fastening points is reduced.

Furthermore, as illustrated in FIG. 4D, each second supporting member 22 is secured in the Z direction by the first restraining member 23 and the second restraining member 24 provided at the two respective end sides thereof in the Y direction. Hence, in spite of the reduction in the number of fastening points, a high strength in the securing of the second supporting member 22 is provided.

Furthermore, in the present embodiment, the second solar cell module 32 is secured to the mounting member 4 by being fitted to the second supporting member 22. Hence, the second solar cell module 32 can be fastened to the second supporting member 22 without using any tools. Therefore, the number of fastening points is further reduced, and the ease of construction is increased.

Figure 5:
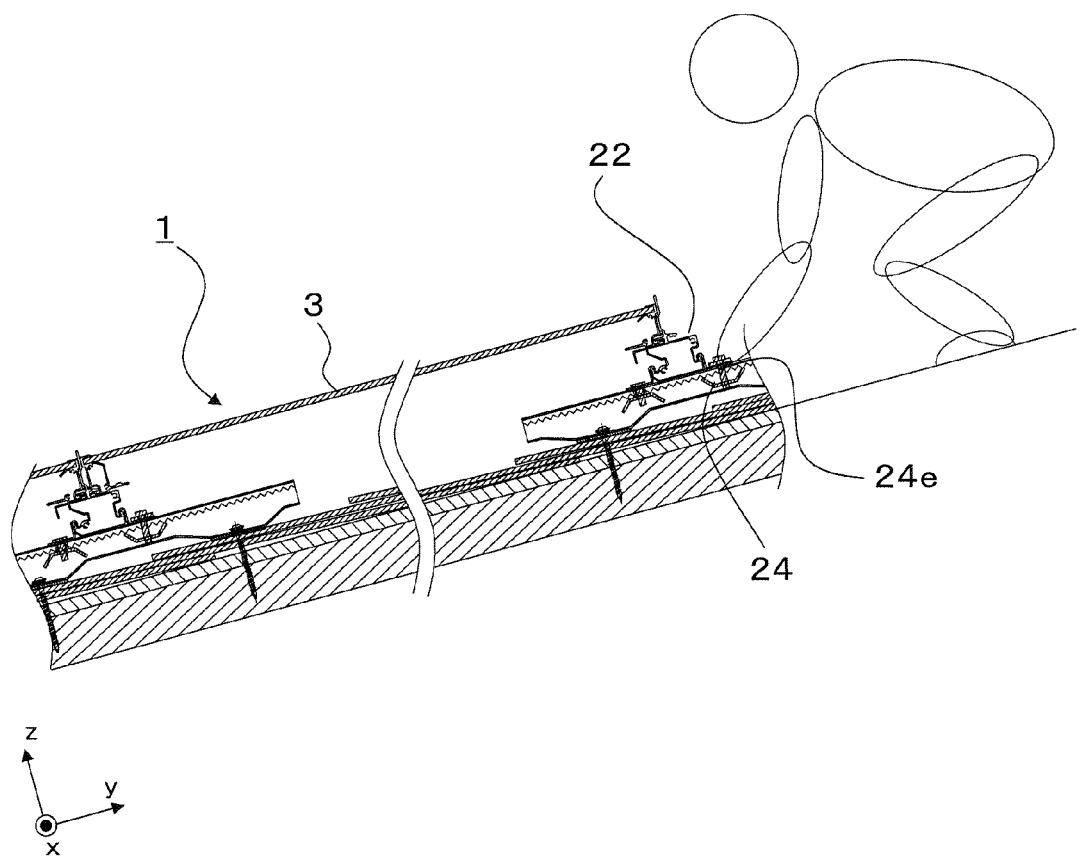
FIG. 5 is a model diagram illustrating how a worker constructs the solar cell array according to the first embodiment.

Furthermore, as illustrated in FIG. 5, while the solar cell module 3 is placed on the second supporting member 22, the securing member 24e of the second restraining member 24 can be attached on the first supporting member 21. Thus, damage to the solar cell elements 17 that may occur in a case where a worker steps on the solar cell modules 3 during the installation work is reduced.

Second Embodiment

Figure 6:
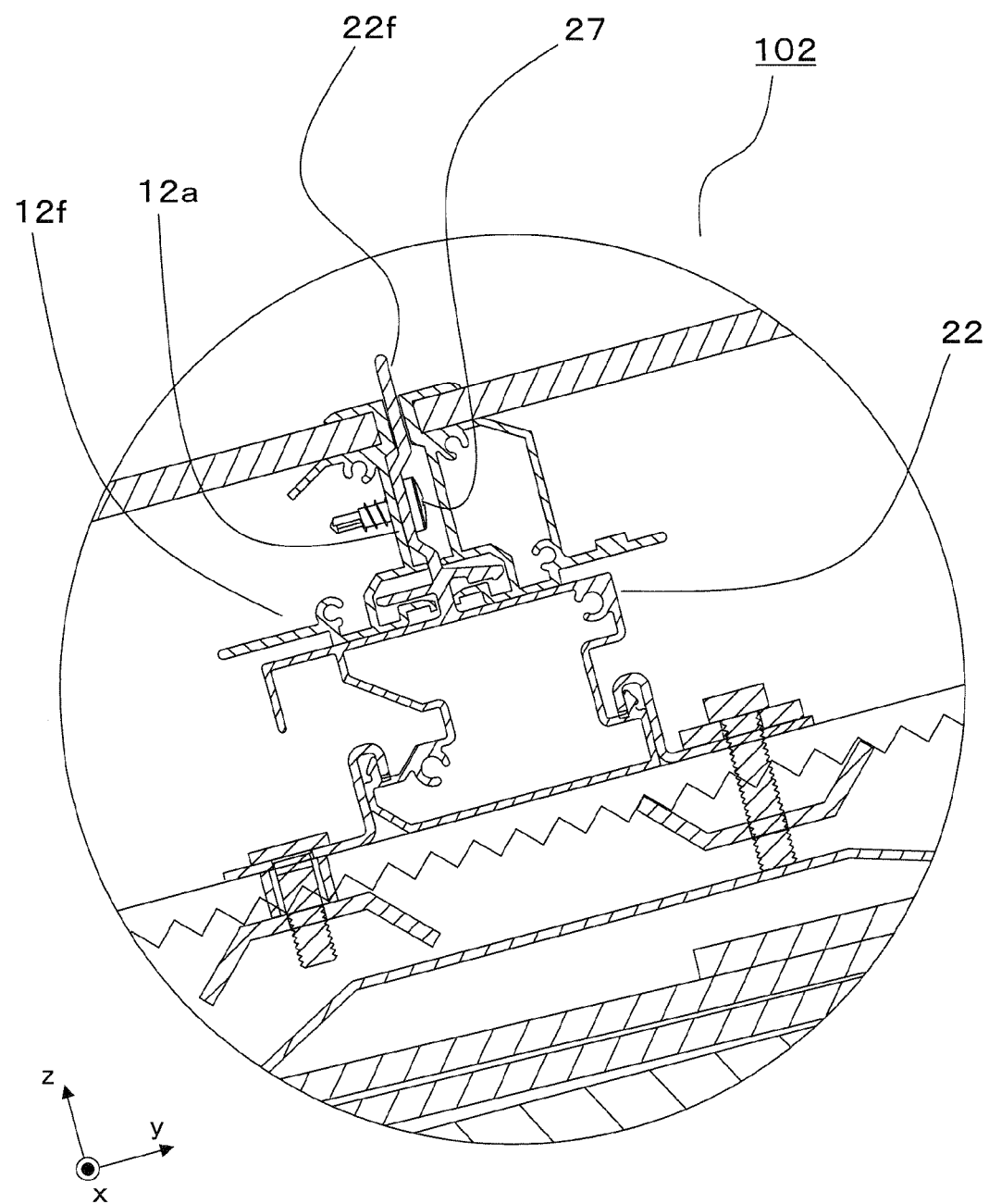
FIG. 6 is a sectional view illustrating a part of a solar cell array according to a second embodiment that corresponds to the part illustrated in FIG. 1C.
Figure 7:
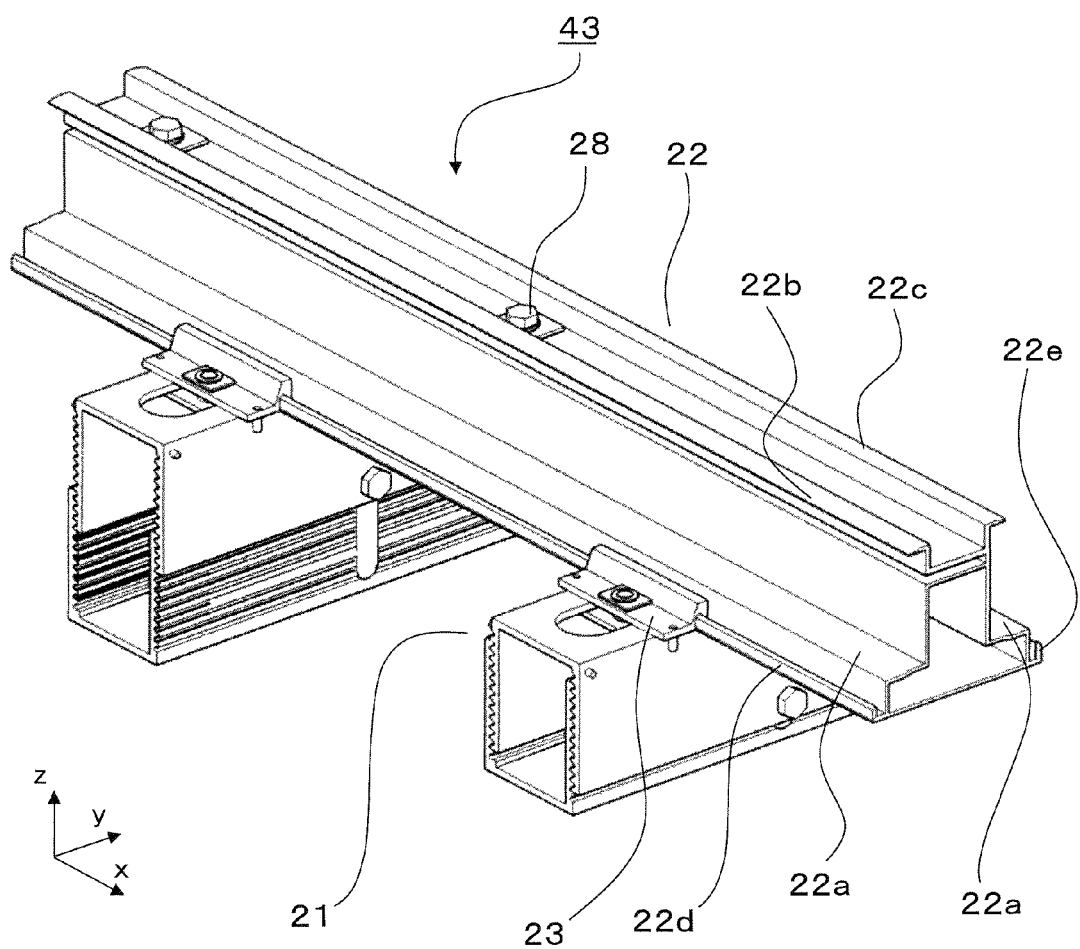
FIG. 7 is a perspective view illustrating a mounting member included in a solar cell array according to a third embodiment.

Referring to FIG. 6, a solar cell array 102 according to a second embodiment will now be described in detail.

The solar cell array 102 according to the present embodiment differs from that according to the first embodiment in the mechanism of the second supporting member 22 that secures the side faces of the solar cell modules 3.

Mounting members 42 included in the solar cell array 102 each further include a screw 27 extending through the plate-like portion 22f and the frame side face 12a of the ridge-side frame 12f. Hence, the plate-like portion 22f of the second supporting member 22 is secured to the frame side face 12a of the ridge-side frame 12f with the screw 27.

With the screw 27, solar cell modules 3 that are adjacent to each other in the X direction with the second supporting member 22 interposed therebetween can be electrically connected to each other. Thus, in a case where the length of the second supporting member 22 in the X direction is larger than the length of each solar cell module 3 in the X direction, the number of grounding wires for grounding the solar cell array 102 can be reduced, whereby the construction work is more simplified.

It is sufficient that the screw 27 is provided for each of two solar cell modules 3 that are adjacent to each other in the X direction.

Third Embodiment

Referring to FIGS. 7 and 8A to 8C, a solar cell array 103 according to a third embodiment of the present invention will now be described in detail.

The solar cell array 103 differs from that according to the first embodiment in the mechanism of the second supporting member 22 that secures the side faces of the solar cell modules 3.

The present embodiment differs from the first embodiment in the shape of the second supporting member 22 of each of mounting members 43 included in the solar cell array 103. As illustrated in FIGS. 7 and 8A to 8C, the first projecting portion 22b and the second projecting portion 22c are each in contact with the frame upper face 12c of the frame 12 of a corresponding one of the solar cell modules 3.

That is, as in the first embodiment, the first projecting portion 22b and the second projecting portion 22c are each not limited to be inserted into the frame recessed portion 12b of a corresponding one of the frames 12. As in the present embodiment, each frame 12 may be held between the first projecting portion 22b or the second projecting portion 22c and a corresponding one of the second supporting portions 22a from the upper side and the lower side, respectively. In such a case, the frame 12 of each of the solar cell modules 3 is secured between the first projecting portion 22b and the second supporting portion 22a or between the second projecting portion 22c and the second supporting portion 22a.

Thus, the force with which the second supporting member 22 secures the solar cell modules 3 to the mounting member 43 is increased. Furthermore, in the solar cell array 103, a frame 12 not including the frame recessed portion 12b is also securable. In this respect, the solar cell array 103 has good versatility.

Furthermore, in the solar cell array 103, the mounting member 43 includes a space portion 22h provided below the first projecting portion 22b and extending in the X direction, and screws 28 extending through the first projecting portion 22b and the space portion 22h. The space portion 22h is provided between a pair of plate portions that are substantially parallel to the bottom portion 21a of the first supporting member 21.

In the second supporting member 22, the second projecting portion 22c is joined to the upper one of the plate portions, and the second supporting portion 22a is joined to the lower one of the plate portions. Two plate portions included in the pair of plate portions are joined to each other on one side thereof in the Y direction.

In the present embodiment, by fastening the second supporting member 22 having the space portion 22h with the screws 28, the frame 12 of the first solar cell module 31 positioned on the eaves side can be held and secured by the second supporting member 22, and the frame 12 of the second solar cell module 32 positioned on the ridge side can be inserted to the second supporting member 22. Thus, in the present embodiment also, the solar cell array 103 can be constructed without the worker's stepping onto the solar cell modules 3.

<Construction Method>

With the space portion 22h, in the solar cell array 103, the solar cell modules 3 can be more firmly secured by the following construction method.

Figure 8A:
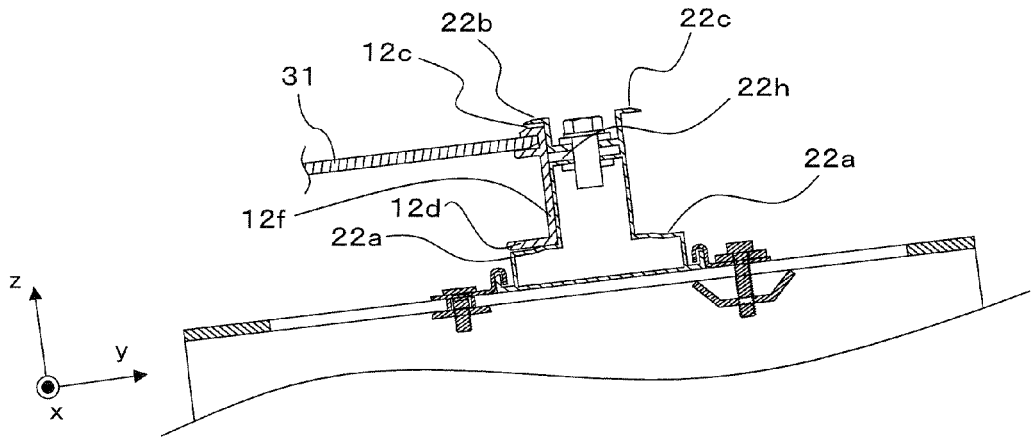
FIGS. 8A to 8C include schematic diagrams illustrating steps of constructing the solar cell array according to the third embodiment.

First, as illustrated in FIG. 8A, the second supporting member 22 is slid in the Y direction toward the ridge side, whereby the ridge-side frame 12f is inserted between a corresponding one of the second supporting portions 22a and the first projecting portion 22b.

Figure 8B:
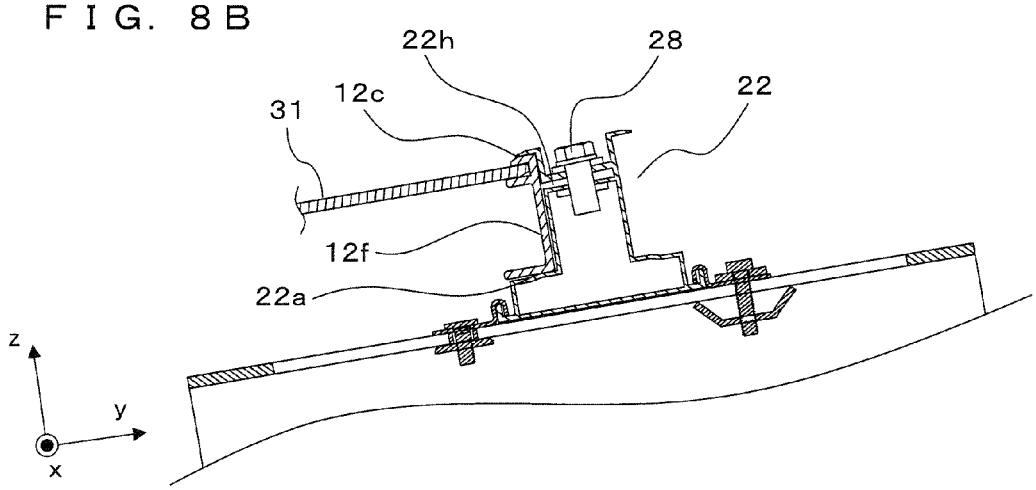

Subsequently, as illustrated in FIG. 8B, the screws 28 are provided and are fastened, whereby the first projecting portion 22b of the second supporting member 22 bends downward, narrowing the space portion 22h. Accordingly, the first projecting portion 22b presses the ridge-side frame 12f, whereby the first solar cell module 31 is firmly secured.

Figure 8C:
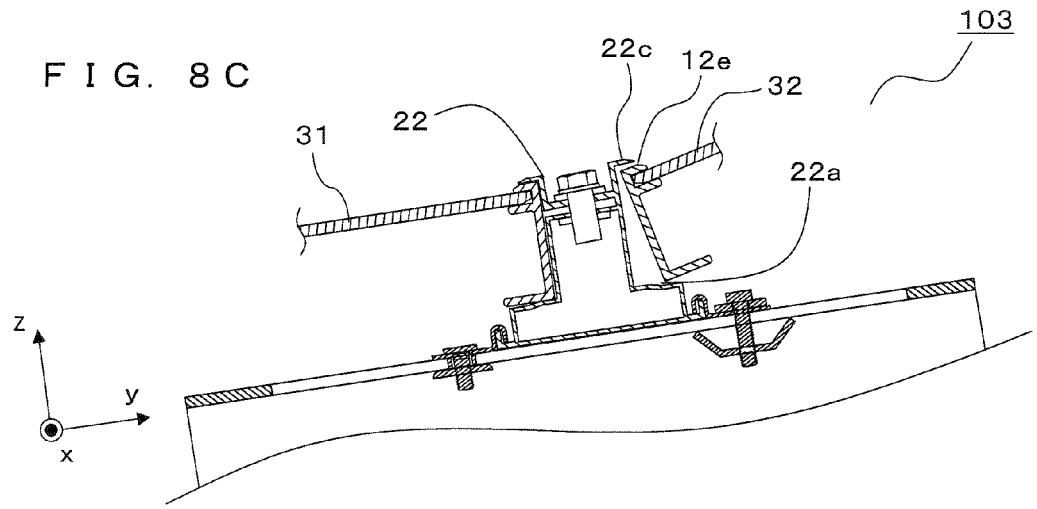
Figure 9A:
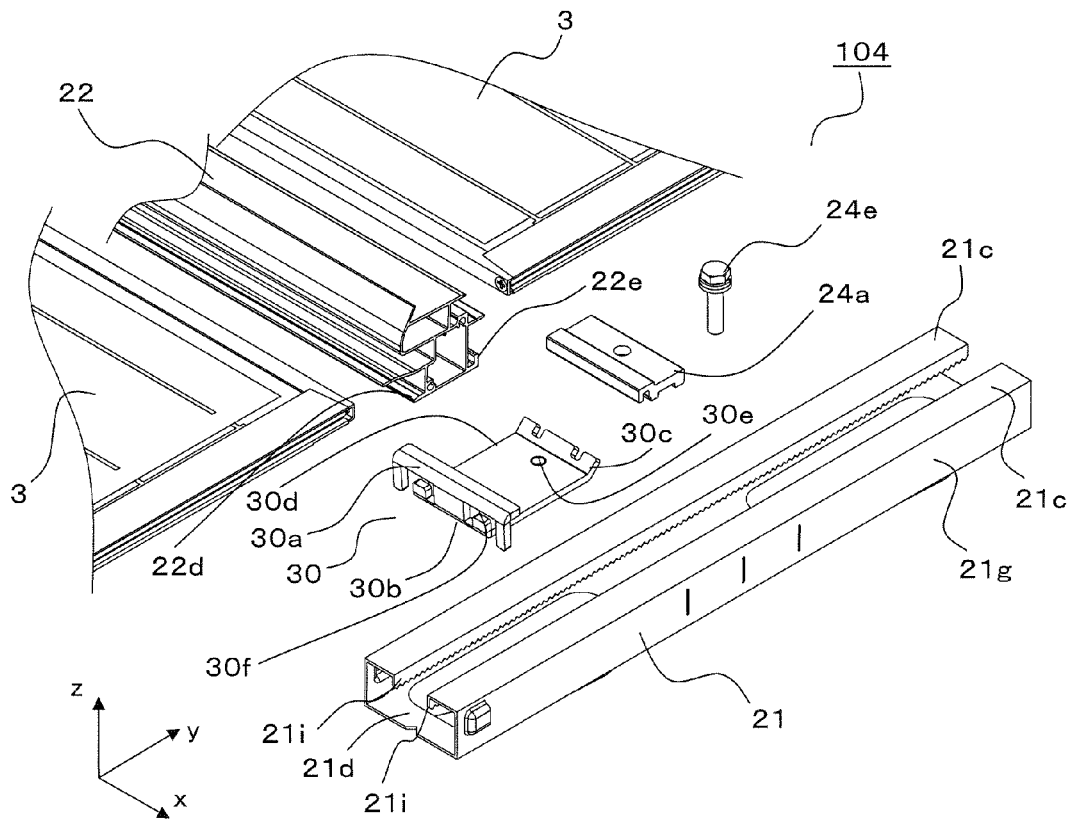
Figure 9B:
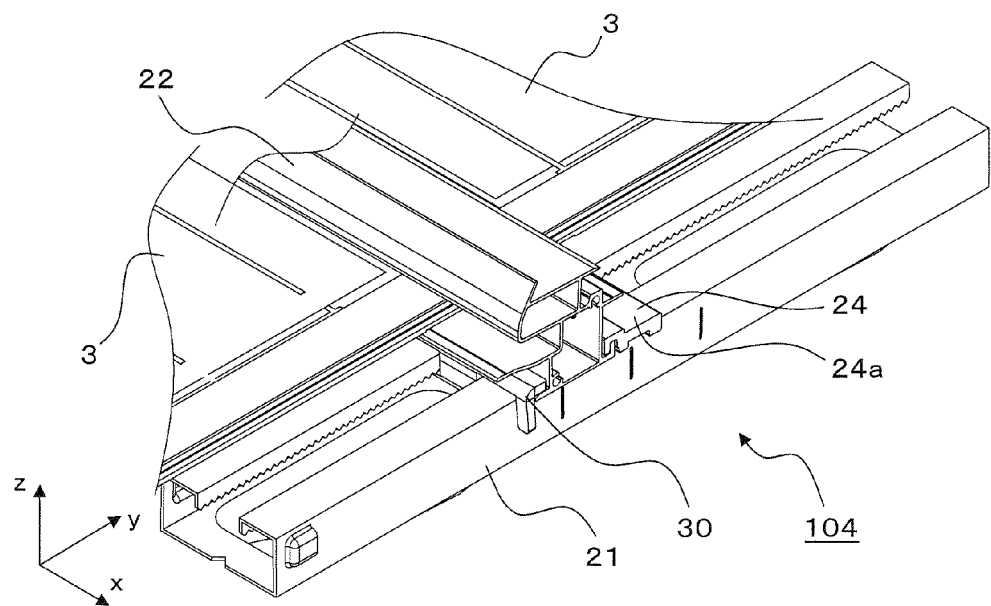

Meanwhile, as illustrated in FIG. 8C, the gap between the other second supporting portion 22a and the second projecting portion 22c is widened, making it easy to insert the eaves-side frame 12e of the second solar cell module 32.

Fourth Embodiment

Referring to FIGS. 9A, 9B, 10 and 11A to 11D, a solar cell array 104 according to a fourth embodiment will now be described.

The solar cell array 104 differs from those according to the first to third embodiments in employing a first restraining member 30 that includes a part extending in the Y direction in the cavity portion 21d of the first supporting member 21 such that the first stopper faces the second restraining member.

Figure 10:
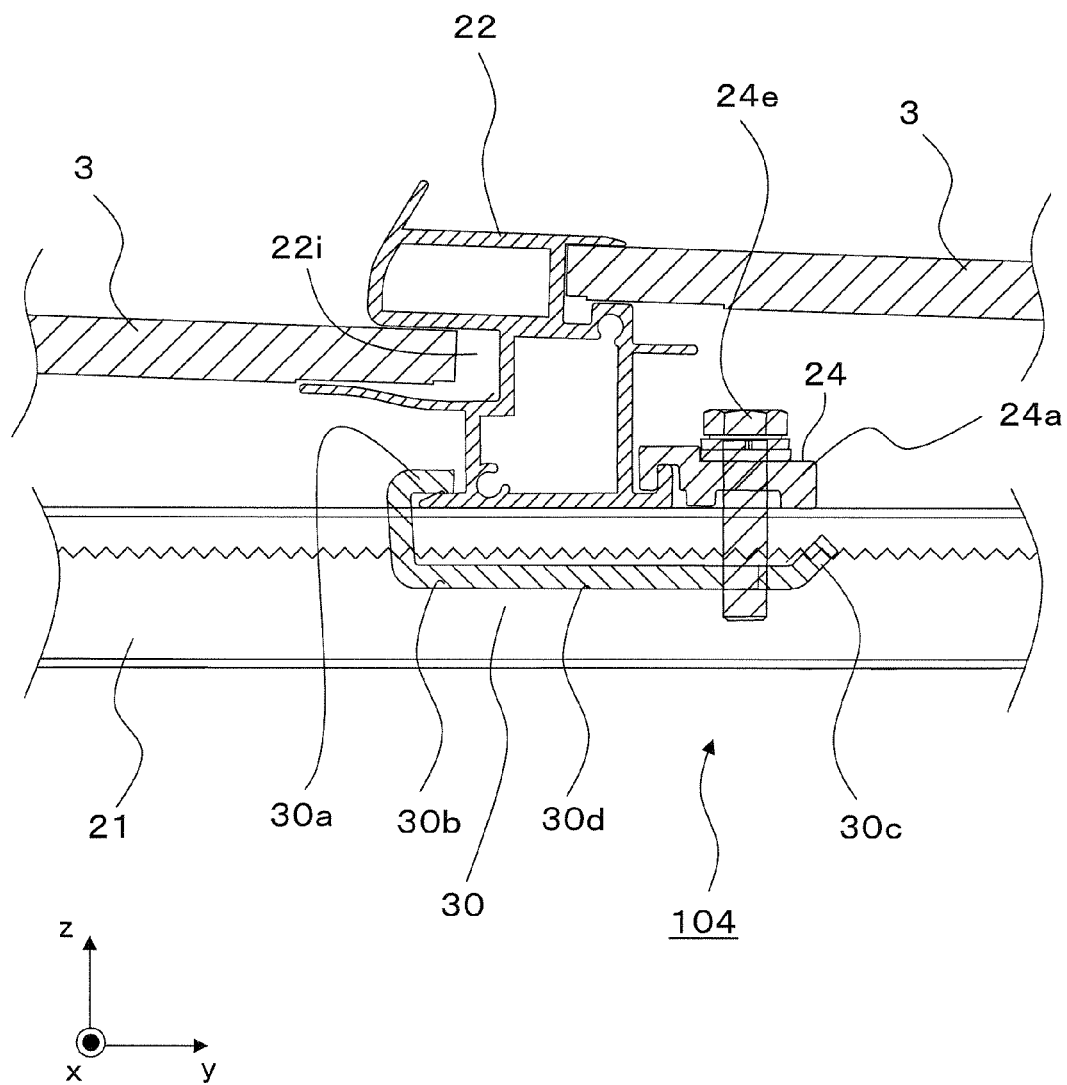
FIG. 10 is a sectional view illustrating a part of the solar cell array according to the fourth embodiment that corresponds to the part illustrated in FIG. 1C.

As illustrated in FIGS. 9 and 10, the first restraining member 30 includes a first engaging portion 30a, a front stopper portion 30b, a rear stopper portion 30c, a connecting portion 30d, and a screw hole 30e provided in the connecting portion 30d. In the present embodiment, a part corresponding to the first stopper according to any of the first to third embodiments includes the front stopper portion 30b, the rear stopper portion 30c, and the connecting portion 30d. The connecting portion 30d connects the front stopper portion 30b and the rear stopper portion 30c and extends in the Y direction. Hence, in the present embodiment, the part corresponding to the first stopper is placed in the cavity portion 21d of the first supporting member 21. Furthermore, the first restraining member 30 includes groove portions 30f provided between the first engaging portion 30a and the front stopper portion 30b and fitting a shape formed by the sections of the first supporting portions 21c, the side portions 21g, and the inner wall portions 21i of the first supporting member 21. The groove portions 30f are each slightly wider than the thickness of the sections of the first supporting portions 21c, the side portions 21g, and the inner wall portions 21i of the first supporting member 21. Hence, the first restraining member 30 is movable along the first supporting member 21.

The first restraining member 30 engages with the first supporting member 21 at the groove portions 30f, thereby being restrained at one end side thereof in the Y direction from moving in the X direction and in the Z direction while being allowed to move in the Y direction. Hence, when the securing member 24e that secures the second engaging member 24a to the first restraining member 30 is loosened, the first restraining member 30 becomes movable in the Y direction on the first supporting member 21 together with the second supporting member 22, the second engaging member 24a, and the securing member 24e. When the securing member 24e is fastened, the gap between the second engaging member 24a and the connecting portion 30d is narrowed, and the rear stopper portion 30c engages with the inner wall portions 21i. Hence, the second supporting member 22 is also restrained from moving in the Y direction and is consequently secured to the first supporting member 21. That is, in the present embodiment, the first supporting portions 21c and the inner wall portions 21i included in the first supporting member 21 are held between the second engaging member 24a and first restraining member 30, whereby the second supporting member 22 is secured to the first supporting member 21 with the securing member 24e. Hence, the second supporting member 22 can be secured to the first supporting member 21 without the need of providing the second stopper 24c to the second restraining member 24. Consequently, the number of components is reduced. Accordingly, the ease of construction on the installation surface is increased.

<Construction Method>

The solar cell array 104 can be constructed by the following method.

Figure 11A:
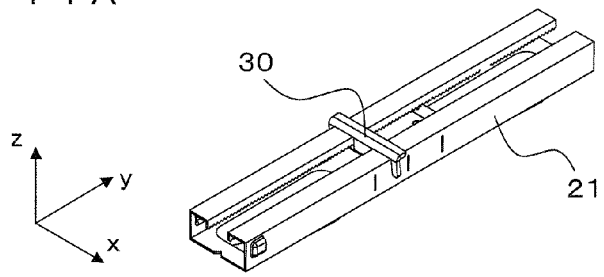
FIGS. 11A to 11D include schematic diagrams illustrating steps of constructing the solar cell array according to the fourth embodiment.

First, as illustrated in FIG. 11A, the groove portions 30f of the first restraining member 30 are fitted onto the first supporting member 21.

Figure 11B:
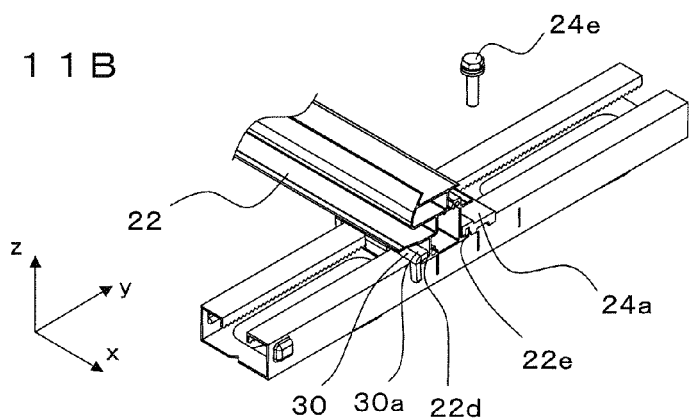

Subsequently, as illustrated in FIG. 11B, the first protruding portion 22d of the second supporting member 22 is made to engage with the first engaging portion 30a of the first restraining member 30. Subsequently, the second protruding portion 22e of the second supporting member 22 is locked by the second engaging member 24a of the second restraining member 24. Subsequently, the securing member 24e is inserted into the screw hole 30e provided in the connecting portion 30d, whereby the second engaging member 24a is loosely secured to the first supporting member 21. In this step, the second supporting member 22, the first restraining member 30, and the second restraining member 24 are fixed with respect to the first supporting member 21 in the Z direction but are allowed to move in the Y direction.

Figure 11C:
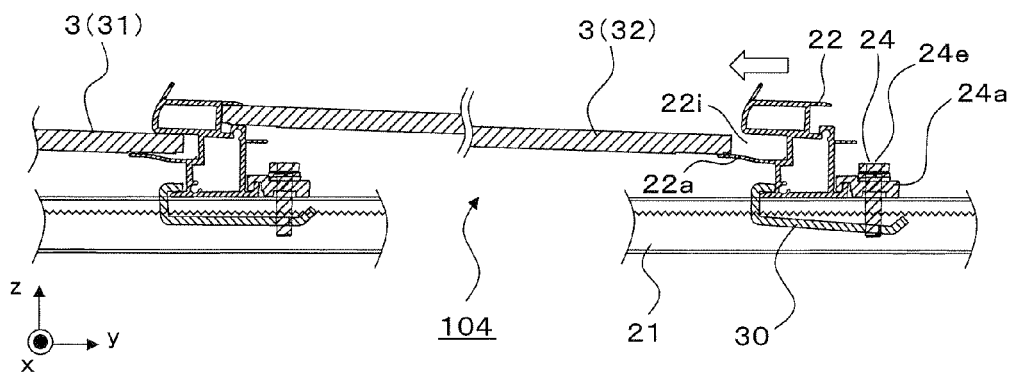
Figure 11D:
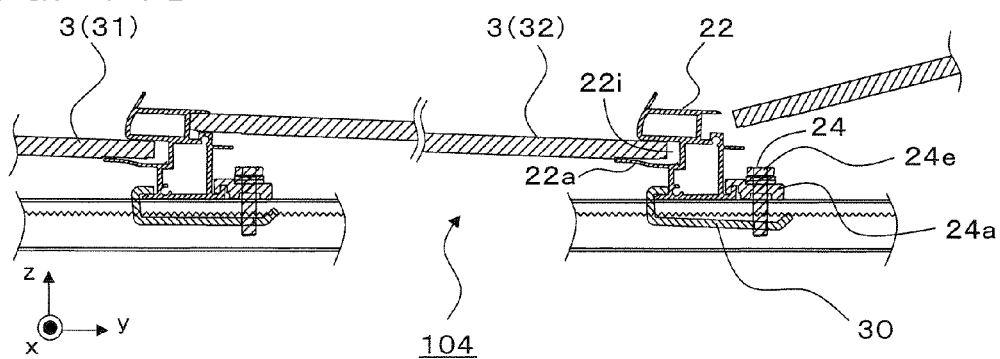

Subsequently, as illustrated in FIG. 11C, the solar cell module 32 is placed on the second supporting portion 22a of the second supporting member 22. Subsequently, as illustrated in FIG. 11D, the second supporting member 22, the first restraining member 30, and the second restraining member 24 that are placed on the first supporting member 21 are moved together in the −Y direction (toward the eaves side), whereby the solar cell module 32 is made to engage with a first recessed portion 22i of the second supporting member 22. Subsequently, the securing member 24e is tightly fastened, whereby the second supporting member 22 is secured to the first supporting member 21. By repeating the above series of steps, the solar cell array 104 is constructed.

The present invention is not limited to the above embodiments, and many modifications and changes can be made thereto within the scope of the present invention. Needless to say, the present invention encompasses any combinations of the above embodiments.

For example, solar cell arrays to which the present invention is applicable are not limited to those described in the above embodiments. For example, the present invention is also suitably applicable to a configuration in which the first supporting member 21 is a long rail.

Moreover, the place where the solar cell array is installed is not limited to the sloping surface described in the above embodiments and may be a horizontal surface.

Furthermore, the solar cell module 3 is not limited to those having a superstrate configuration described in the above embodiment and may be those having a glass-package configuration, a sub-strate configuration, or any of other configurations.

REFERENCE SIGNS LIST 1, 102, 103, 104 solar cell array
2 sloping surface
2a shingle
2b sheathing roof board
2c rafter
3 solar cell module
4 mounting member
11 solar cell panel
11a light-receiving surface
11b non-light-receiving surface
12 frame
12a frame side face
12b frame recessed portion
12c frame upper face
12d frame bottom face
12e eaves-side frame
12f ridge-side frame
12g fitting portion
13 backside-protecting member
14 light-transmissive substrate
15 filler member
16 inner lead
17 solar cell element
18 terminal box
21 first supporting member
21a bottom portion
21b through hole
21c first supporting portion
21d cavity portion
21e serrated portion
21f come-off-preventing portion
21g side portion
21h rail groove portion
21i inner wall portion
22 second supporting member
22a second supporting portion
22b first projecting portion
22c second projecting portion
22d first protruding portion
22e second protruding portion
22f plate-like portion
22g bottom portion
22h space
23 first restraining member
23a first engaging member
23b first hook portion
23c first stopper
23c1 first flat portion
23c2 first bent portion
23e shaft portion
24 second restraining member
24a second engaging member
24b second hook portion
24c second stopper
24c1 second flat portion
24c2 second bent portion
24e securing member
25 screw
27, 28 screw
29 adhesive member
30 first restraining member
30a first engaging portion
30b front stopper portion
30c rear stopper portion
30d connecting portion
30e screw hole
30f groove portion

The invention claimed is:

1. A solar cell array comprising:
a plurality of solar cell modules arranged in a first direction of an installation surface; and
a mounting member configured to secure adjacent ones of the plurality of solar cell modules,
wherein the mounting member comprises
a first supporting member extending in the first direction;
a second supporting member provided on the first supporting member and extending in a second direction that is orthogonal to the first direction;
a first restraining member provided on one side of the second supporting member in the first direction and configured to restrain the second supporting member from moving in the second direction and in a height direction that is orthogonal to the first direction and the second direction; and
a second restraining member provided on another side of the second supporting member in the first direction and configured to restrain the second supporting member from moving in the height direction,
wherein the first restraining member is movable together with the second supporting member in the first direction on the first supporting member, and
wherein the second restraining member restrains the second supporting member from moving in the first direction,
wherein the first restraining member comprises a first engaging member that is movable in the first direction on the first supporting member, and a first hook portion that projects from the first engaging member toward the second supporting member and connects the first engaging member to the second supporting member,
wherein the second restraining member comprises a second engaging member that is movable in the first direction on the first supporting member, a second hook portion that projects from the second engaging member toward the second supporting member and connects the second engaging member to the second supporting member, and a securing member that secures the second engaging member to the first supporting member,
wherein the first supporting member is a hollow columnar body that comprises a bottom portion extending in the first direction, a pair of upper supporting portions provided opposite the bottom portion and extending in the first direction, a rail groove portion provided between the pair of upper supporting portions and extending in the first direction, and a cavity portion provided between the bottom portion and the pair of upper supporting portions,
wherein the first restraining member comprises a first stopper placed in the cavity portion of the first supporting member,
wherein the second restraining member comprises a second stopper placed in the cavity portion of the first supporting member,
wherein the rail groove portion comprises inner wall portions projecting downward from the pair of upper supporting portions, respectively, and each having irregularities at a lower end thereof,
wherein the first stopper comprises a first flat portion that is in contact with the lower ends of the inner wall portions, and
wherein the second stopper comprises a second flat portion spaced apart from the lower ends of the inner wall portions, and second bent portions extending from two respective ends of the second flat portion in the first direction toward the upper supporting portions and being in contact with the lower ends of the inner wall portions.

2. The solar cell array according to claim 1, wherein the first stopper further comprises first bent portions extending from two respective ends of the first flat portion in the first direction toward the bottom portion.

3. The solar cell array according to claim 1, wherein the second supporting member is secured to the first supporting member with the securing member securing the second engaging member and the second stopper that hold the upper supporting portions therebetween.

4. The solar cell array according to claim 1,
wherein the second supporting member comprises a supporting portion configured to support lower faces of the plurality of solar cell modules, a plate portion standing on the supporting portion, and a projecting portion projecting from the plate portion toward at least one side thereof in the first direction, and
wherein a side face of a corresponding one of the plurality of solar cell modules engages with a gap between the projecting portion and the supporting portion.

5. The solar cell array according to claim 4, wherein the side face of the corresponding one of the plurality of solar cell modules comprises a recessed portion fitted on the projecting portion.

6. The solar cell array according to claim 4, wherein the projecting portion is in contact with an upper face of the corresponding one of the plurality of solar cell modules.

7. The solar cell array according to claim 4,
wherein the second supporting member supports side faces of two of a plurality of solar cell modules that are adjacent to each other in the second direction, and
wherein the plurality of solar cell modules that are adjacent to each other in the second direction are each secured to the second supporting member by a screw extending through the side face of the solar cell module and the plate portion.

8. The solar cell array according to claim 1,
wherein the plurality of solar cell modules are secured to a sloping surface sloping in the first direction, and
wherein the first restraining member is provided on a lower side with respect to the second supporting member in a sloping direction of the sloping surface, and the second restraining member is provided on an upper side with respect to the second supporting member in the sloping direction of the sloping surface.

* * * * *